(12) United States Patent
Hsu et al.

(10) Patent No.: US 6,753,562 B1
(45) Date of Patent: Jun. 22, 2004

(54) SPIN TRANSISTOR MAGNETIC RANDOM ACCESS MEMORY DEVICE

(75) Inventors: Sheng Teng Hsu, Camas, WA (US); Jinke Tang, New Orlean, LA (US); Keizo Sakiyama, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/401,203

(22) Filed: Mar. 27, 2003

(51) Int. Cl.[7] ............................................... H01L 29/76
(52) U.S. Cl. ........................ 257/295; 257/183; 257/193
(58) Field of Search ................................ 257/295, 183, 257/192

(56) References Cited

U.S. PATENT DOCUMENTS

| | | | |
|---|---|---|---|
| 5,565,695 A | 10/1996 | Johnson | |
| 5,652,445 A | 7/1997 | Johnson | |
| 5,654,566 A | 8/1997 | Johnson | |
| 5,962,905 A | 10/1999 | Kamiguchi et al. | |
| 6,297,987 B1 | 10/2001 | Johnson et al. | |
| 6,355,953 B1 | 3/2002 | Kirczenow | |
| 6,482,729 B2 | 11/2002 | Ohno et al. | |
| 6,501,143 B2 | 12/2002 | Sato et al. | |
| 6,522,573 B2 | 2/2003 | Saito et al. | |

OTHER PUBLICATIONS

Michael Oestreich, "Injecting spin into electronics", Nature, vol. 402, Dec. 16, 1999, p. 735–736.

Z. Wang, L.D.Tung, W. Wang, L. Spinu, W. Zhou, J. Tang, "Room temperature ferromagnetic semiconductor in Fe–doped reduced–rutile", Phys. Rev. Lett., submitted.

C.M. Hu, J. Nitta, A. Jensen, J.B. Hansen, H. Takayanagi, T. Matsuyama, D. Haitmann, U. Merkt, "Spin injection across a hybrid heterojunction: Theoretical understanding and experimental approach", Journal of Applied Physics, vol. 91, No. 10, May 15, 2002, p. 7251–7255.

R.F. Pierret, "1. The junction field effect transistor", in Modular series on solid state devices, vol. 4, Field effect devices, R.F. Pierret, G.W. Neudeck, Editors, 1983 Addison–Wesley Publishing Company, Inc., pp. 3–10.

R.F. Pierret, "5.MOS field effect transistor", in Modular series on solid state devices, vol. 4, Field effect devices, R.F. Pierret, G.W. Neudeck, Editors, 1983 Addison–Wesley Publishing Company, Inc., pp. 81–85.

*Primary Examiner*—Fetsum Abraham
(74) *Attorney, Agent, or Firm*—David C. Ripma; Matthew D. Rabdau

(57) ABSTRACT

A spin transistor employing the ferromagnetic semiconductor/semiconductor heterojunction is disclosed. The ferromagnetic semiconductor layers form heterojunctions directly on the source and drain of a regular field effect transistor. Using room temperature ferromagnetic semiconductor materials such as iron doped titanium oxide, the spin transistor can have improved spin injection efficiency due to the conductance matching of the ferromagnetic semiconductor with the semiconductor source and drain. The spin transistor further comprises writing plates to modify the magnetic polarization of the ferromagnetic layers to provide memory states. The spin transistor can be used as a memory cell in a magnetic random access memory with potentially large memory signal by utilizing the magnetic moment induced resistivity change.

16 Claims, 7 Drawing Sheets

SPIN TRANSISTOR MAGNETIC RANDOM ACCESS MEMORY DEVICE

BACKGROUND OF THE INVENTION

The present invention relates generally to spintronic (spin electronic) device, comprising semiconductor structures in combination with ferromagnetic components. More specifically, it relates to information storage of integrated circuit memory devices using spintronic memory cells.

Semiconductor integrated circuit (IC) memory devices have replaced magnetic-core memory devices due to their lower fabrication cost and higher performance. An IC memory circuit includes a repeated array of memory cells which store one state of a two state information (0 or 1), or multi-state information (for example, 00, 01, 10, or 11 of 4 states), together with support circuitry such as a row decoder, a column decoder, a write circuit to write to the memory cell array, a control circuitry to select the correct memory cell, and a sense amplifier to amplify the signal.

One early memory circuit is a flip-flop that has an output that is stable for only one of two possible voltage levels. SRAM (static random access memory) circuit stores information in flip-flops where the information can be read from any memory cell at random (random access memory), and where the stored information can be kept indefinitely as long as the circuit receives power.

The next generation memory cell is a DRAM (dynamic random access memory) cell. A DRAM cell typically consists of a transistor and a capacitor. The capacitor stores information in the form of electrical charge and the transistor provides access to the capacitor. Because of the inherent leakage of the capacitor charge, DRAM cells must be rewritten or refreshed at frequent intervals.

SRAM and DRAM memories cannot retain the stored information without a power source, therefore they belong to a class of memory called volatile memory. Another class of memory is called non-volatile memory which will still retain the stored information even after the power is turned off.

A typical non-volatile memory is ferroelectric random access memory (FRAM). Similar to a DRAM cell, a FRAM cell consists of an access transistor and a storage capacitor. The difference is that FRAM cell uses ferroelectric material for its capacitor dielectric wherein the stored information is the polarization of the ferroelectric material. Ferroelectric material can be polarized by an electric field with a polarization lifetime of about 10 years.

Recent developments of materials that have changeable electrical resistance have introduced a new kind of non-volatile memory, called RRAM (resistive random access memory). The basic component of a RRAM cell is a variable resistor. The variable resistor can be programmed to have high resistance or low resistance (in two-state memory circuits), or any intermediate resistance value (in multi-state memory circuits). The different resistance values of the RRAM cell represent the information stored in the RRAM circuit.

The advantages of RRAM are the simplicity of the circuit which leads to smaller devices, the non-volatile characteristic of the resistor memory cell, and the stability of the memory state.

Since resistor is a passive component and cannot actively influence nearby electrical components, a basic RRAM cell can be just a variable resistor, arranged in a cross point resistor network to form a cross point memory array. To prevent cross talk or parasitic current path, a RRAM cell can further include a diode, and this combination is sometimes called a 1R1D (or 1D1R) cross point memory cell. To provide better access, a RRAM can include an access transistor, as in DRAM or FRAM cell, and this combination is sometimes called a 1R1T (or 1T1R) cross point memory cell.

The resistance states of the RRAM can be represented by different techniques such as structural, polarization, or magnetization state. Chalcogenide alloy is an example of structural state RRAM device. Chalcogenide alloys can exhibit two different stable reversible structural phases, namely an amorphous phase with high electrical resistance and a polycrystalline phase with lower electrical resistance. Resistive heating by an electrical current pulse can change the phases of the chalcogenide materials. One example of polarization state is a polymer memory element. The resistance state of a polymer memory element is dependent upon the orientation of polarization of the polymer molecules. The polarization of a polymer memory element can be written by applying an electric field.

MRAM (magnetic random access memory) is another class of RRAM circuits using magnetic properties for storing information based on magnetoresistance effect wherein the resistance of a magnetic material can be programmed. The magnetoresistance effect in MRAM devices are caused by the spins of electrons (corresponding to the rotation of the electron around its own axis).

In ferromagnetic materials, the electron spins can be aligned in one direction under the influence of an external field, and can keep their alignment even after the external field is removed (the hysteresis effect). At high temperatures (above Curie temperature), the ferromagnetic materials become paramagnetic (non-magnetic) because of the loss of the spin alignment due to high thermal energy.

In an MRAM cell employing magnetoresistance effect, conduction carriers (electrons or holes) with certain spins alignment are generated from a spin-polarized ferromagnetic source, and are injected into a non-ferromagnetic channel, and then detected at a spin-analyzer ferromagnetic drain. The conduction carriers are allowed to move more freely from the ferromagnetic source to the ferromagnetic drain if the magnetization in those source and drain are parallel than if they are antiparallel or partially antiparallel. The variation of the resistance is the magnetoresistance effect and the device is often called a spin valve device in view of the fact that the magnetization states of the ferromagnetic source and drain act like a valve for spin-polarized carriers.

In the typical spin valve devices, the non-ferromagnetic channel is a non-ferromagnetic metal. To improve the magnetoresistance effect, the channel can be a thin insulator, and the spin valve device is called a magnetic tunnel junction (MTJ). In a MTJ, the magnetoresistance results from the spin-polarized tunneling of conduction electrons between the two ferromagnetic layers. The tunneling current depends on the relative orientation of the magnetic moments of the two ferromagnetic layers.

The operation of the spin valve devices depends on the difference in the magnetization states of the two ferromagnetic layers. In practical devices, one of the ferromagnetic layers is pinned while the other ferromagnetic layer is free to change polarization. This free layer stores information based on the direction of the magnetic polarization with respect to the pinned layer. A variation of the spin valve structure is a pseudo spin valve wherein the pinned ferromagnetic layer is replaced by a thicker ferromagnetic layer with higher coercive strength. The higher coercive strength prevents the thicker ferromagnetic layer to change magnetic polarization during the change of magnetic polarization of the other ferromagnetic layer.

Further developments of the spin valve devices have led to a hybrid field of semiconductor and magnetic materials called spintronic (spin electronic). Semiconductors and magnetic materials have been studied extensively, but only recently devices having a combination of properties and functions of both materials were studied.

In a spintronic device, the non-ferromagnetic channel is a semiconductor material. However, spin injection from a ferromagnetic material to a semiconductor material is difficult due to the heterojunction between the ferromagnetic material and the semiconductor material. The heterojunction represents an important quantity which may place fundamental constraints on the expected efficiency of the injection process. Interfacial problems and the differences in carrier number and energy levels across the interface are possible difficulties in the heterojunction between the ferromagnetic material and the semiconductor material. At the interface, ferromagnetic metals have randomly oriented spins (called magnetically dead layer), and this creates a barrier to effective spin injection. In metals, the number of charge carriers is large and cannot be controlled easily. In semiconductors, the number of carriers (and therefore the resistivity) can be controlled easily by impurity doping. Conductivity mismatch problem of metal/semiconductor junction is severed in ferroelectric metal/semiconductor heterojunctions. Lattice mismatch could also lead to dislocations which act as spin scatterers and reduce spin injection efficiency.

A number of spintronic devices employing ferromagnetic metal/semiconductor heterojunction have been disclosed.

Johnson, U.S. Pat. No. 5,565,695, "Magnetic spin transistor hybrid circuit element", Oct. 15, 1996, discloses a hybrid memory cell consisting of a magnetic spin transistor and a semiconductor isolation transistor to improve isolation and signal to noise readout characteristics in a random access memory circuit.

Johnson, U.S. Pat. No. 5,652,445, "Hybrid Hall device and method of operation", Jul. 29, 1997, discloses a ferromagnetic gated field effect transistor having a ferromagnetic material in proximity to, or as part of, the gate over the conducting channel to provide improved devices that can be used easily and reliably in high density memory and logic environments.

Johnson, U.S. Pat. No. 5,654,566, "Magnetic spin injected field effect transistor and method of operation", Aug. 5, 1997, discloses a hybrid field effect transistor using ferromagnetic materials for the source and drain with the spin-polarized conduction electrons injected from the ferromagnetic materials through a semiconductor channel.

Johnson, U.S. Pat. No. 6,297,987, "Magnetoresistive spin-injection diode". Oct. 2, 2001, discloses a magnetoresistive spin-injection diode consisting a semiconducting channel, a single ferromagnetic layer and a barrier to prevent interdiffusion.

Kirczenow, U.S. Pat. No. 6,355,953, "Spintronic devices and method for injecting spin polarized electrical currents into semiconductors", Mar. 12, 2002, discloses atomically ordered interfaces between suitable semiconductor materials and suitable ferromagnetic materials to improve the injection of spin-polarized conduction electrons. Sato et al., U.S. Pat. No. 6,501,143, "Spin-valve transistor", Dec. 31, 2002, discloses a spin valve transistor having a semiconductor emitter and a semiconductor collector, together with a spin valve device as a base to improve the magnetoresistance ratio and the ratio of the collector/emitter current.

Saito et al., U.S. Pat. No. 6,522,573, "Solid-state magnetic memory using ferromagnetic tunnel junctions", Feb. 18, 2003, discloses a solid-state memory using ferromagnetic tunneling element on a semiconductor substrate to achieve higher capacity, high reliability and high yield.

The spintronic devices in these prior art disclosures comprise a heterojunction of a ferromagnetic metal and a semiconductor material. This heterojunction between a metal and a semiconductor may present fundamental constraint on the efficiency of the spin injection process such as conductance mismatch, ferromagnetic dead layer, carrier number and energy mismatch at the heterojunction interface.

One proposed solution for the conductance mismatch at the ferromagnetic/semiconductor heterojunction is the insertion of a tunnel contact layer. This approach introduces additional complexity to the fabrication of the spin transistors.

Another solution to the conductance mismatch is a ferromagnetic semiconductor/semiconductor heterojunction since there is no interface problem with a magnetic semiconductor and semiconductor heterojunction. Oestreich in Nature, Vol. 402, Dec. 16, 1999, p. 735, "Injecting spin into electronics", reviews the progress of spin injection in electronic devices with two groups of Fiederling and Ohno showing feasibility of ferromagnetic semiconductor/semiconductor heterojunction at low temperatures. Fiederling et al. show that spin injection from a semimagnetic to a semiconductor is highly efficient, about 90%. The material used is unusual (BeMnZnSe II–VI semiconductor compound, Curie temperature is about a few degrees Kelvin), and acts as a spin aligner to inject to a GaAs semiconductor. Ohno et al. use GaMnAs (a group III–V semiconductor) as a spin aligner to inject holes through a GaAs spacer into a quantum well.

One of the difficulties of the ferromagnetic semiconductor/semiconductor heterojunction is the development of ferromagnetic semiconductor materials, especially at room temperature. EuS (Curie temperature $T_c$=16.6 K) is one of the very few natural ferromagnetic semiconductors. The majority of ferromagnetic semiconductors are diluted magnetic semiconductors fabricated in laboratory conditions.

Diluted magnetic semiconductors are semiconductors containing a large fraction of magnetic ions ($Mn^{2+}$, $Cr^{2+}$, $Fe^{2+}$, $Co^{2+}$). They are studied mainly on II–VI based materials because the 2+ magnetic ions are easily incorporated into the host II–VI crystal by replacing group II cations. But II–VI materials are difficult to dope to create p- and n-type, which makes the materials less attractive for semiconductor applications. Examples of II–VI based ferromagnetic semiconductors are (CdMn)Te, ZnSe, $Zn_{1-x}Mn_xO$, GaN, $Zn_{1-x}Co_xS$ ($T_c$=73 K to 300 K), $CdCr_2Se_4$ ($T_c$=113 K).

The obstacle of making diluted magnetic semiconductor from III–V group is the low solubility of magnetic element in the compounds. However, advances in thin film fabrication techniques such as MBE (molecular beam epitaxy) have made the formation of these non-equilibrium thin films possible. Examples of III–V based ferromagnetic semiconductors are $Ga_{1-x}Mn_xAs$ ($T_c$=110 K), (GaMn)Sb, (GaFe)Sb, Mn doped InAs ($T_c$=77 K).

A number of spintronic devices employing ferromagnetic semiconductor/semiconductor heterojunction have also been disclosed, though not for memory applications.

Kamiguchi et al., U.S. Pat. No. 5,962,905, "Magnetoresistive element", Oct. 5, 1999, discloses a magnetoresistive element in the form of a bipolar transistor with the base material being a ferromagnetic semiconductor to achieve large output and to show an amplifying effect.

Ohno et al., U.S. Pat. No. 6,482,729, "Method of generating spin-polarized conduction electron and semiconductor device", Nov. 19, 2002, discloses a spin-polarized field effect transistor having a multilayer ferromagnetic semiconductor/semiconductor on top of the semiconductor source and drain of a regular field effect transistor to form the spin-polarized electronic injecting source and drain electrodes.

One of the difficulties with ferromagnetic semiconductor/semiconductor spin transistor is the low operating temperature of the ferromagnetic semiconductor, which make it unpractical in everyday applications.

Therefore it is advantageous to provide a ferromagnetic semiconductor/semiconductor heterojunction with an operating temperature higher than room temperature.

It is also advantageous to provide simplified spin-polarized field effect transistor for better control and fabrication.

It is also advantageous to provide simplified spin-polarized field effect transistor for memory applications.

SUMMARY OF THE INVENTION

Accordingly, a spintronic device with improved spin injection due to conductance matching is provided. The present invention spintronic device employs a plurality of ferromagnetic semiconductor/semiconductor heterojunctions to improve the spin injection from the ferromagnetic material into the semiconductor material.

The present invention also discloses the usage of room temperature ferromagnetic semiconductor materials such as iron doped titanium oxide for practical spintronic device applications.

The present invention also provides a spin transistor with the ferromagnetic semiconductor materials forming heterojunctions directly with the source and drain for simplified device fabrication process and potentially better spin injection.

The present invention also provides a magnetic random access memory application utilizing the disclosed spin transistor as a memory cell.

In one aspect of the invention, the spintronic device comprises two layers of ferromagnetic semiconductor materials (a source and a drain) sandwiching a layer of semiconductor material with the semiconductor layer forming two heterojunctions with the ferromagnetic semiconductor layers. A bias voltage or current is applied across the ferromagnetic layers, and the spin-polarized carriers (electrons or holes depending on the ferromagnetic semiconductor materials) are generated in the source ferromagnetic semiconductor layer, injected into the semiconductor layer through the ferromagnetic semiconductor/semiconductor heterojunction, and then collected at the drain ferromagnetic layer. Depending on the relative magnetic polarizations of the two ferromagnetic layers, most, some or only a few of the spin-polarized carriers can be collected, representing the various states of the spintronic device.

The ferromagnetic semiconductor can be a natural ferromagnetic semiconductor material such as EuS, or a diluted ferromagnetic semiconductor such as (CdMn)Te, $Zn_{1-x}Mn_xO$, $Zn_{1-x}Co_xS$ ($T_c$=73 K to 300 K), $CdCr_2Se_4$ ($T_c$=113 K). $Ga_{1-x}As$ ($T_c$=110 K), (GaMn)Sb, (GaFe)Sb, Mn doped InAs ($T_c$=77 K).

In a preferred embodiment, for practical applications, the ferromagnetic semiconductor materials are room temperature ferromagnetic semiconductors, i.e. the Curie temperature of the ferromagnetic semiconductor materials is higher than 20° C. (or 293 K). The ferromagnetic semiconductor material can be iron doped titanium oxide ($Fe_xTi_{1-x}O_{2-}$)(see Wang et al., "*Room temperature ferromagnetic semiconductor in Fe-doped reduced rutile*", Phys. Rev. Lett., submitted), or cobalt doped titanium oxide.

The spintronic device can be fabricated on a substrate and can further comprise wiring layers electrically connected to the ferromagnetic semiconductor layers to provide carriers to the spintronic device from a bias voltage or current source. The spintronic device can further comprise a plurality of writing layer in the vicinity of the ferromagnetic semiconductor layers to supply a magnetic field to the ferromagnetic semiconductor layers to modify their magnetic polarization to change the magnetoresistance property of the spintronic device.

The semiconductor interface in the spintronic device can be highly doped to improve the contact between the ferromagnetic semiconductor layer and the semiconductor layer. The surface concentration of the highly doped region in the semiconductor layer can be higher than $10^{20}$ cm$^{-3}$ to ensure good contact between the ferromagnetic semiconductor layer and the semiconductor layer. The heterojunction of the ferromagnetic semiconductor layer and the semiconductor layer can be further improved by the salicidation of the semiconductor layer to improve the efficiency of injecting carriers from the ferromagnetic semiconductor layer to the semiconductor layer. The salicide can be titanium silicide, cobalt silicide, or nickel silicide. In the preferred embodiment of iron doped titanium oxide ferromagnetic semiconductor material, nearly perfect conductance match between the iron doped titanium oxide ferromagnetic semiconductor and the semiconductor material is possible with the Schottky barrier eliminated or reduced for greatly enhancing the spin injection efficiency.

The semiconductor in the spintronic device can be a II–VI, III–V or IV group semiconductor materials such as InSb, InAs, GaAs, InAsP, Si or Ge. In a preferred embodiment, the semiconductor material is chosen to have a good lattice match with the ferromagnetic semiconductor material to reduce dislocations and thus less spin scattering. The thickness of the semiconductor layer is preferably less than 150 nm for efficient spin injected electron transport through the source ferromagnetic material to the drain ferromagnetic material.

The majority carriers of the ferromagnetic semiconductor materials and the semiconductor material can be the same, meaning they are all of p-type semiconductors, or they are all of n-type semiconductor. The majority carriers of the ferromagnetic semiconductor materials and the semiconductor material can also be different to form various p-n junctions.

In other aspect of the invention, the spintronic device is a spin transistor. The spin transistor comprises a field effect transistor with a source ferromagnetic semiconductor layer and a drain ferromagnetic semiconductor layer forming heterojunctions of ferromagnetic semiconductor/semiconductor directly with the source and drain of the transistor. The field effect transistor in the spin transistor is a general-type field effect transistor comprising a semiconductor layer having a source and a drain separated by a channel, the conductance of which is controlled by a voltage applied to a gate located in the vicinity of the transistor channel and normally in physical contact with the transistor channel through a gate insulator. The general-type field effect transistor are described in detail in R. F. Pierret, "*Chapter 1. The junction field effect transistor*", p. 3–10, and "*Chapter 5. MOS field effect transistors*", p. 81–85 in Modular series on solid state devices, R. F. Pierret, G. W. Neudeck, Editors, 1983, Addison-Wesley Publishing Company, hereby incorporated by reference.

The conductance of the channel can also be controlled by the relative magnetic polarization of the ferromagnetic layers. If the magnetization in those ferromagnetic layers are parallel, the conductance is higher than if they are antiparallel or partially antiparallel. In this aspect, the spin transistor is a memory cell with the data stored is the relative magnetization states of the source and drain ferromagnetic layers. The magnetization states of the ferromagnetic layers can be modified by a magnetic field generated by external write currents through a plurality of conductive write plates located in the vicinity of the ferromagnetic layers. A first write plate can be located in the vicinity of the drain ferromagnetic semiconductor layer and a second write plate can be located in the vicinity of the source ferromagnetic semiconductor layer.

The spin transistor can be fabricated on a substrate and can further comprise wiring layers electrically connected to the ferromagnetic semiconductor layers to provide carriers to the spintronic device. The spin transistor can further comprise wiring layer electrically connected to the gate to control the conductance of the transistor channel. The spintronic device can further comprise a plurality of wiring layers electrically connected to the write plates to supply the write current to modify the magnetization of the ferromagnetic layers.

The spin transistor is preferably having a short channel length of less than 150 nm for efficient spin injection from the source through the surface channel to the drain region. The source and drain regions in the spin transistor are preferably highly doped to provide conduction carriers. The thickness of the highly doped source and drain regions is preferably less than 100 nm to enhance the magnetoresistance effect. The surface concentration of the highly doped source and drain regions in the field effect transistor can be higher than $10^{20}$ cm$^{-3}$ to ensure good contact between the ferromagnetic semiconductor layer and the semiconductor layer. The heterojunction of the ferromagnetic semiconductor layer and the semiconductor layer can be further improved by the salicidation of the source and drain regions to improve the efficiency of injecting carriers from the ferromagnetic semiconductor source layer to the semiconductor layer. The salicide can be titanium silicide, cobalt silicide, or nickel silicide. In the case of iron doped titanium oxide ferromagnetic semiconductor material, nearly perfect conductance match between the iron doped titanium oxide ferromagnetic semiconductor and the semiconductor material is possible. Schottky barrier can be eliminated or reduced to greatly enhance the spin injection efficiency. Since the highly doped junction depth is very shallow, the resistivity of the highly doped junction is much higher than that of the ferromagnetic layer. When the channel is turned on and a bias voltage is applied to the drain electrode, spin electrons or holes from the source ferromagnetic layer is injected through the surface channel and is collected by the drain junction, then flow through the ferromagnetic drain electrode to the collector electrode. Thus beside the normal spin transistor action, a series resistor is added to the drain of the transistor. Since the resistivity of this series resistor is spin dependent, it enhances the memory device output signal.

The spin transistor can further comprise a p-well or n-well region for isolation. The transistor channel can be p channel or n channel. The source and drain regions can be highly doped p+ or n+.

The ferromagnetic semiconductor can be a natural ferromagnetic semiconductor material such as EuS, or the ferromagnetic semiconductor can be a diluted ferromagnetic semiconductor such as (CdMn)Te, $Zn_{1-x}Mn_xO$, $Zn_{1-x}Co_xS$ ($T_c$=73 K to 300 K), $CdCr_2Se_4$ ($T_c$=113 K), $Ga_{1-x}Mn_xAs$ ($T_c$=110 K), (GaMn)Sb, (GaFe)Sb, Mn doped InAs ($T_c$=77 K).

For practical applications, the ferromagnetic semiconductor materials are room temperature ferromagnetic semiconductors, i.e. the Curie temperature of the ferromagnetic semiconductor materials is higher than 25° C. (or 298 K). The ferromagnetic semiconductor material can be iron doped titanium oxide ($Fe_xTi_{1-x}O_{2-}$), or cobalt doped titanium oxide.

The semiconductor in the spintronic device can be a II–VI, III–V or IV group semiconductor materials such as InSb, InAs, GaAs, InAsP, Si or Ge. The semiconductor material is chosen to have a good lattice match with the ferromagnetic semiconductor material to reduce dislocations and thus less spin scattering.

The majority carriers of the ferromagnetic semiconductor materials and the semiconductor material can be the same, meaning they are all of p-type semiconductors, or they are all of n-type semiconductor.

In other aspect of the invention, the spintronic transistor is a memory cell to store a data state. The memory cell consists of only a spin transistor but functions as an one-resistor-one-transistor (1R1T) memory cell with the resistor is the resistance of the spintronic transistor channel. The magnetic memory cells can be arranged in a traditional x-y array for high density memory fabrication. A magnetic random access memory includes an array of memory cells, together with other circuit components such as a row decoder, a column decoder, a write circuit to write to the memory cell array, control circuitry to select the correct memory cell resistor, and a sense amplifier to amplify the signal before sending it to the voltage comparator.

DETAILED DESCRIPTION OF THE INVENTION

Figure 1:
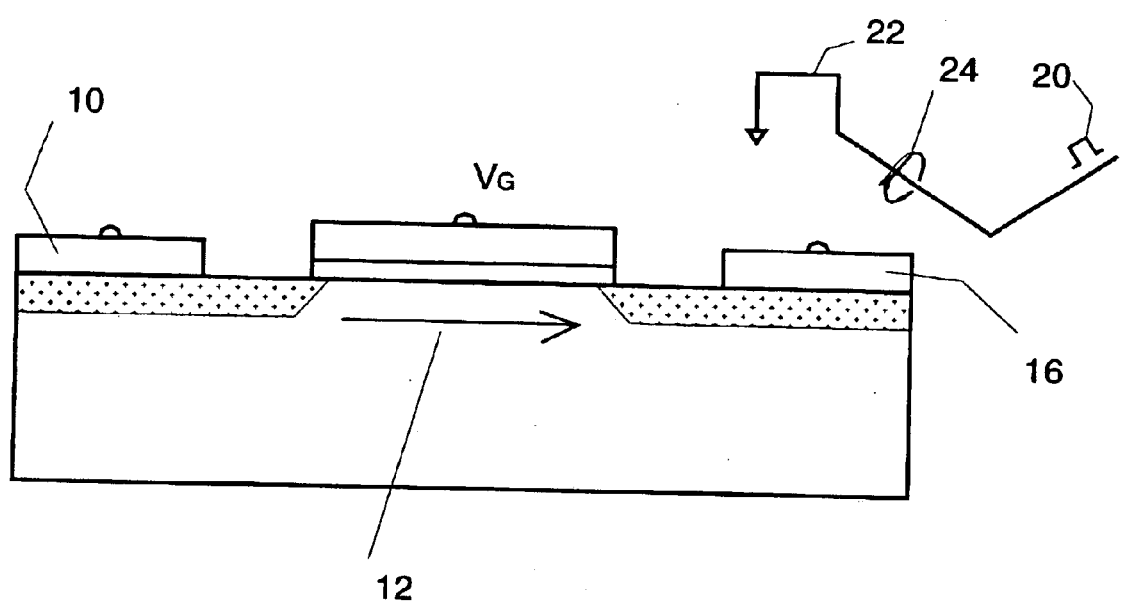
FIG. 1 is a prior art spin transistor using ferromagnetic materials.

FIG. 1 shows a prior art spin transistor using ferromagnetic metal material similar to one disclosed by Johnson (#5,654,566). A ferromagnetic film 10 at the source of the field effect transistor provides spin-polarized carriers to a high mobility channel 12. The conductance of the high mobility channel 12 is determined by a gate voltage $V_G$. A ferromagnetic film 16 at the drain presents a spin sensitive impedance to current flow, so that the device conductance is high when the magnetization of the source 10 and drain 16 ferromagnetic materials are aligned parallel, and low when antiparallel. If the magnetization of the one of the ferromagnetic films 10 and 16 is set in one particular orientation (for example "up" orientation), then the resistance of the device has two distinct states determined by the magnetization orientation of the other ferromagnetic film (such as "up" parallel to the first ferromagnetic film, or "down" antiparallel to the first ferromagnetic film). Thus the prior art spin field effect transistor can be used as non-volatile memory element. A logical data value can be written by using the magnetic fields from current pulses in overlaid write lines to orient the magnetization of one of the ferromagnetic films 10 and 16. The write lines are shown schematically over the ferromagnetic film at the drain 16. In a write procedure, sending a write current pulse 20 down the write line 22 (located in proximity of the ferromagnetic drain 16) generates a magnetic field 24 at the drain 16 and orients the magnetization state of the drain.

The prior art spin transistor uses a heterojunction of ferromagnetic metal and semiconductor. In general, the ferromagnetic metal-semiconductor (2 dimensional electron gas model)-ferromagnetic metal heterojunction devices exhibit small magnetoresistance (see Hu et al. *"Spin injection across a hybrid heterojunction: theoretically understanding and experimental approach*, J. Appl. Phys., Vol. 91, p. 7251, 2002), and therefore not economically feasible for practical memory applications.

Figure 2:
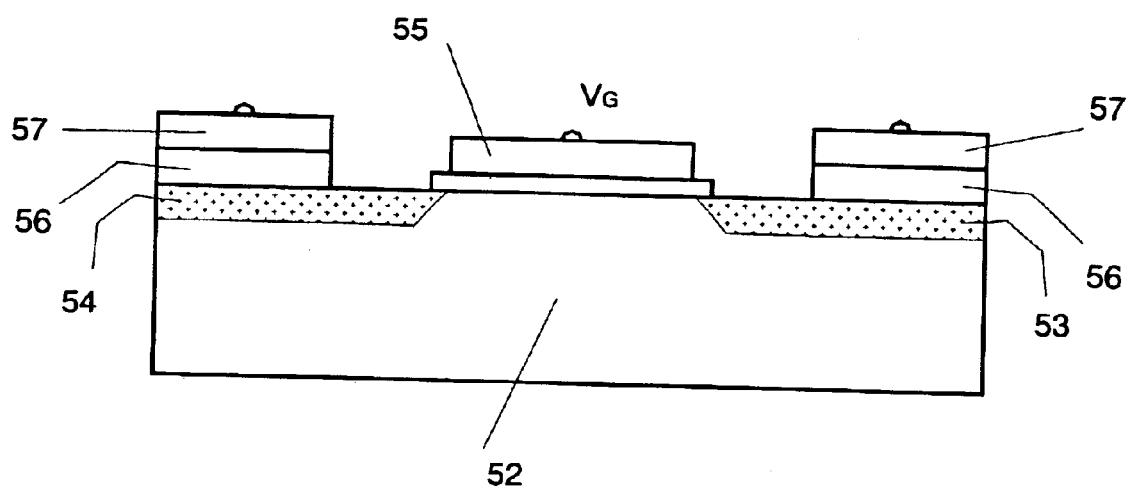
FIG. 2 is a prior art spin transistor using ferromagnetic semiconductor materials.

FIG. 2 shows a prior art spin transistor using ferromagnetic semiconductor/semiconductor heterojunction similar to one disclosed by Ohno et al. (#6,482,729). The spin transistor employs two ferromagnetic semiconductor/nonmagnetic semiconductor heterojunctions applied to the source and drain of a field effect transistor. The spin transistor comprises a general lateral type field effect transistor structure including a semiconductor substrate 52, source and drain region 53 and 54, and a gate 55. A non-magnetic semiconductor layer 56 and a ferromagnetic semiconductor layer 57 are successively grown to form the spin-polarized electronic injecting source and drain electrodes.

The prior art spin transistor uses a conventional field effect transistor with the source and drain connected to heterojunctions of ferromagnetic semiconductor and semiconductor. The heterojunction of ferromagnetic semiconductor and semiconductor reduces the conductivity mismatch and increases the efficiency of spin injection. However, the prior art spin transistor is complicated with extraneous components, and not addressing the memory applications.

Figure 3A:
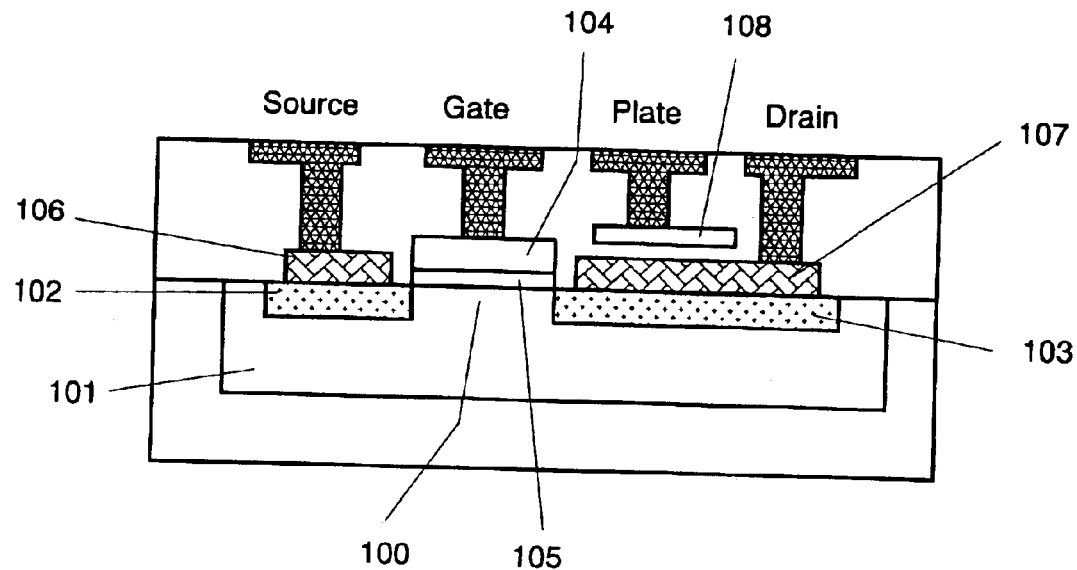
FIG. 3a is the cross section of the present invention spin transistor.

FIG. 3 show the present invention spin transistor using ferromagnetic semiconductor/semiconductor heterojunction for memory applications. FIG. 3a shows a cross section view of the spin transistor. The spin transistor has a p-type channel 100 in a semiconductor substrate 101. typically a n-well. The substrate can be either silicon or compound semiconductors. The source 102 and drain 103 regions are doped to a much higher concentration of carrier p+. Ultra shallow source and drain p+ junctions, preferably no thicker than 100 nm, is preferred to enhance the magnetoresistance effect. The transistor has a gate 104 and a gate insulator 105 to control the conductivity of the transistor channel 100. This is a regular p-type planar field effect transistor.

The spin transistor further comprises two layers of ferromagnetic semiconductor films 106 and 107 forming two heterojunctions directly with the source and the drain regions. The ferromagnetic semiconductor layers are preferably room temperature ferromagnetic semiconductors with the Curie temperature above 20° C. for practical applications. The room temperature ferromagnetic semiconductor material is preferably iron doped titanium oxide in a reduced rutile structure, demonstrably a room temperature p-type ferromagnetic semiconductor and exhibits nearly perfect spin polarization with a large magnetic moment induced resistivity change by Wang et al., hereby incorporated by reference.

The ferromagnetic semiconductor 106 and the source 102 are forming a ferromagnetic semiconductor/semiconductor heterojunction to provide spin polarized conduction electrons. One advantage of ferromagnetic semiconductor such as iron doped titanium oxide is its proximity to a semiconductor, which allows improved spin injection due to the conductance matching with the 2 dimensional electron gas region. When the surface doping concentration of the source and drain regions is higher than $10^{20}$ cm$^{-3}$, a good contact between the ferromagnetic semiconductor and the source and drain layers can be made. Due to the conductance matching between the ferromagnetic semiconductor and the semiconductor. Schottky barrier can be reduced or eliminated to enhance the spin injection efficiency. Very short channel length of less than 150 nm is preferred for efficient spin carriers transports through the surface channel to the drain electrode. Since the source and drain junction depths are very shallow, the resistivity of the source and drain junction is much higher than that of the ferromagnetic semiconductor layer. When the channel is turned on and a bias voltage is applied to the drain electrode, spin polarized carriers from the source ferromagnetic semiconductor is injected to the surface channel and collected by the drain region, and flow though the drain ferromagnetic semiconductor to the collected electrode. Thus besides the normal spin transistor action, a series resistor is added to the drain of the transistor. Since the resistivity of this resistor is spin dependent, it enhances the memory device output signal.

The above description is for a p-type field effect transistor to accommodate p-type ferromagnetic semiconductor layers such as iron doped titanium oxide. For n-type ferromagnetic semiconductors such as cobalt doped titanium oxide, the field effect transistor is n-type. the well is p-well, and the source and drain are n+.

For memory application, the spin transistor requires an external magnetic field to align the magnetic moment of the ferromagnetic semiconductor thin film on both source and drain junction of the device. The magnetic moment of the drain ferromagnetic semiconductor can be reversed by fields supplied by a plate current through a write plate 108 located in proximity of the drain junction of the spin transistor, and by the channel current. The plate current can be in either direction depending on the write bias voltage. The channel current can also be in either direction depending on the bias of the source and the drain of the transistor. Therefore magnetic moment of the ferromagnetic semiconductor on the drain junction can be pinned to a desired polarity by the direction of the current flow in the spin transistor and the current flow in the write plate. The plate current and the channel current are perpendicular, and an appropriate ratio of these two currents can supply a magnetic field at any direction to modify the magnetic moment of the drain ferromagnetic semiconductor layer.

Figure 3B:
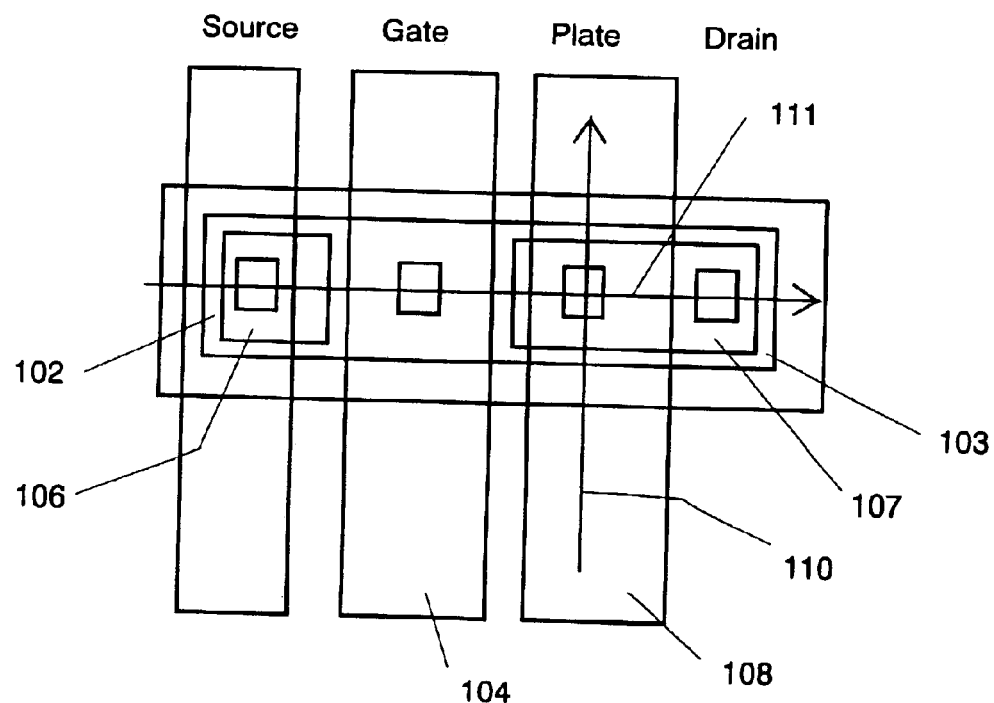
FIG. 3b is the plane view of the present invention spin transistor.

FIG. 3b is the plane view of the present invention spin transistor. FIG. 3b shows the regular field effect transistor with the gate 104, the source 102, and the drain 103 with the channel current direction 111 from the source to the drain. Reversing the polarity of the bias voltage on the source and drain can reverse the channel current direction. The ferromagnetic semiconductor 106 is deposited on the source and the ferromagnetic semiconductor 107 is deposited on the drain of the transistor. The write plate 108 is deposited in proximity of the drain ferromagnetic semiconductor with the write plate current can be in either direction 110.

Figure 4:
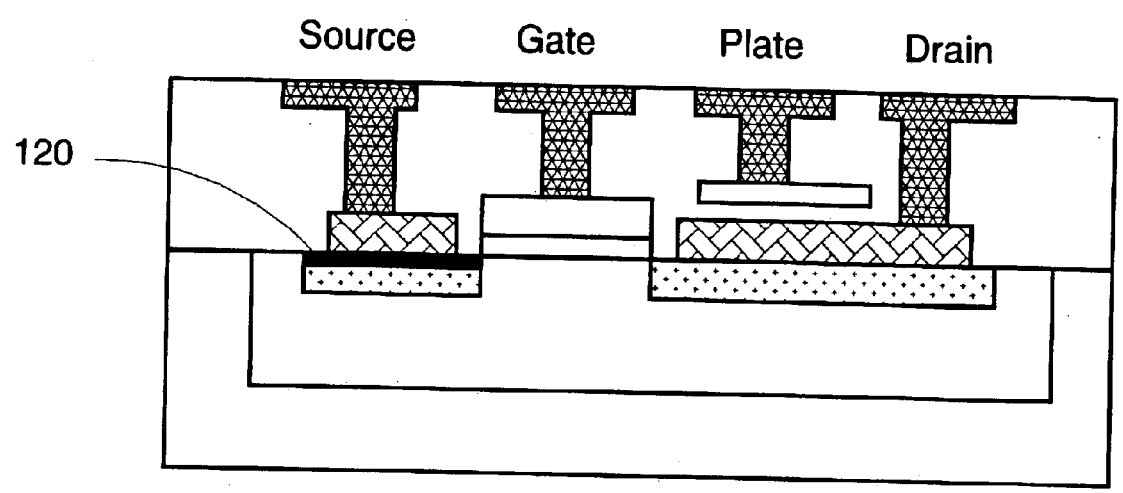
FIG. 4 is the present invention spin transistor using salicide source.

FIG. 4 is the present invention spin transistor using a salicide source. The efficiency of injecting carriers from the source ferromagnetic semiconductor into the channel can be further enhanced by the salicidation of the source layer. A silicide layer 120 such as titanium silicide, cobalt silicide, nickel silicide can form a good contact with the source layer and also with the ferromagnetic semiconductor. Another salicide layer at the drain region (not shown) can also improve the contact resistance between the ferromagnetic semiconductor and the drain layer.

Figure 5:
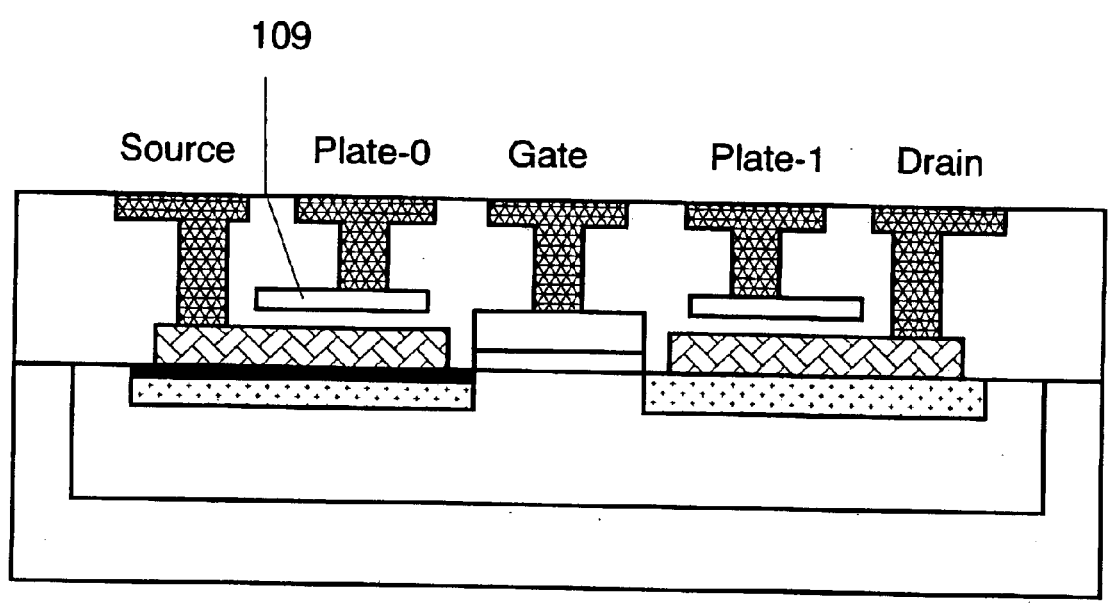
FIG. 5 is another embodiment of the present invention spin transistor.

FIG. 5 is another embodiment of the present invention spin transistor. The spin transistor further comprises a programming plate 109 fabricated in the proximity of the source ferromagnetic semiconductor layer. Similar to the programming of the magnetic moment of the drain ferromagnetic layer, the current in the programming plate 109 and the channel current can form perpendicular components of the magnetic field to control the magnetic moment of the ferromagnetic layer on the source junction.

Figure 6:
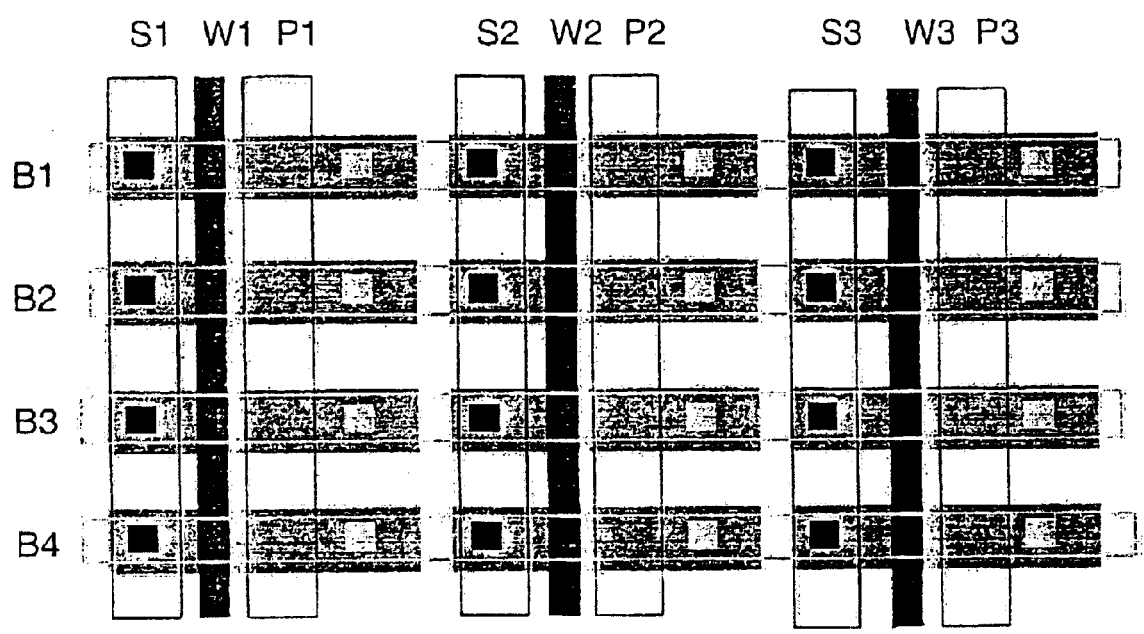
FIG. 6 Is the plane view of a 12-bit memory array using the present invention spin transistor memory cell.

FIG. 6 is the plane view of a 12-bit memory array using the present invention spin transistor memory cell. The as-drawn horizontal bit lines B1–B4 are connected to the drain of the spin transistors. The vertical S1 lines, W1 lines, P1 lines are connected to the source, gate and plate of the spin transistors respectively. Since the as-drawn horizontal bit lines B1–B4 are in the same direction as the channel current of the spin transistor, the current through the bit lines B1–B4 can be used to supply a magnetic field to change the magnetic polarization of the source and drain ferromagnetic layers.

Figure 7:
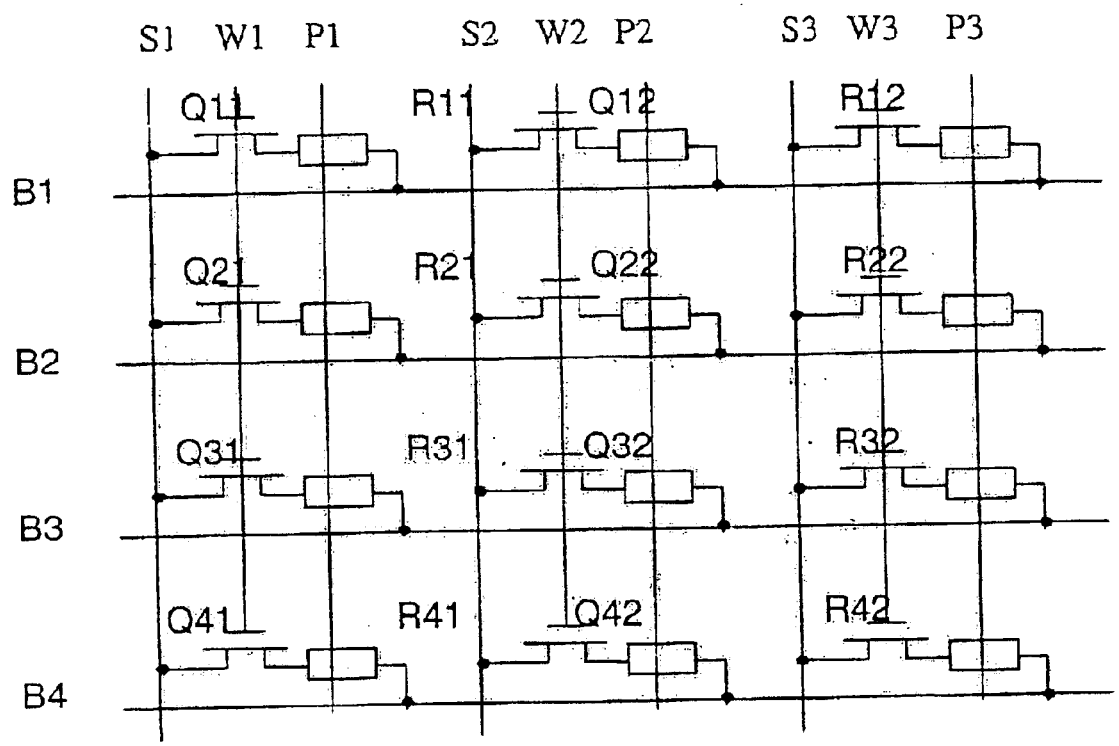
FIG. 7 is the equivalent circuit of a 12-bit memory array using the present invention spin transistor memory cell.

FIG. 7 is the equivalent circuit of the 12-bit memory array shown in FIG. 6. The actual memory cell consists of only a spin transistor but functions as an one-resistor-one-transistor (1R1T) memory cell with the resistor is the resistance of the spintronic transistor channel. The equivalent circuit is then an 1R1T memory cell. The resistor is a programmable resistor, representing the conductance of the spin transistor.

What is claimed is:

1. A spin transistor device comprising
   a field effect transistor comprising a gate controlled conduction channel disposed between a source and a drain; and
   two ferromagnetic semiconductor layers forming heterojunctions directly with the source and drain of the field effect transistor.

2. A device as in claim 1 wherein the ferromagnetic semiconductor material is room temperature ferromagnetic semiconductor.

3. A device as in claim 1 wherein the ferromagnetic semiconductor layer material is an iron doped titanium oxide compound.

4. A device as in claim 1 further comprising
   a first wiring layer provided on the first ferromagnetic semiconductor layer; and
   a second wiring layer provided on the second ferromagnetic semiconductor layer.

5. A device as in claim 1 further comprising a plurality of conductive write lines for carrying a write current, the conductive write lines adapted to supply a magnetic field to the ferromagnetic semiconductor layers.

6. A device as in claim 1 wherein the source and drain of the field effect transistor are doped to a surface carrier concentration of higher than $10^{20}$ cm$^{-3}$.

7. A device as in claim 1 wherein the thickness of the source and drain regions is less than 100 nm.

8. A device as in claim 1 wherein the channel between the source and drain of the field effect transistor is less than 150 nm.

9. A device as in claim 1 further comprising
   a plurality of salicide regions at the interfaces of the ferromagnetic semiconductor layers with the source and drain of the field effect transistor.

10. A device as in claim 9 wherein the salicide is selected from a group consisting of titanium silicide, cobalt silicide, nickel silicide.

11. A device as in claim 1 wherein the semiconductor layer material is a III–V group compound semiconductor.

12. A device as in claim 11 wherein the III–V group compound semiconductor is selected from a group consisting of InSb, InAs, GaAs, or InAsP.

13. A device as in claim 1 wherein the semiconductor layer material is a IV group semiconductor.

14. A device as in claim 13 wherein the IV group semiconductor is one of Si or Ge.

15. A magnetic memory for storing a data state comprising a memory cell comprising
   a field effect transistor comprising a gate controlled conduction channel disposed between a source and a drain;
   two ferromagnetic semiconductor layers forming heterojunctions directly with the source and drain of the field effect transistor; and
   a plurality of conductive write lines for carrying a write current, the conductive write lines adapted to supply a magnetic field to the ferromagnetic semiconductor layers.

16. A magnetic memory as in claim 15 wherein the memory cell is arranged in plurality in a matrix state.

* * * * *